United States Patent
Armbrust et al.

(10) Patent No.: US 7,094,614 B2
(45) Date of Patent: Aug. 22, 2006

(54) IN-SITU MONITORING OF CHEMICAL VAPOR DEPOSITION PROCESS BY MASS SPECTROMETRY

(75) Inventors: Douglas S. Armbrust, Gloucester, MA (US); John M. Baker, Yorktown Heights, NY (US); Arne W. Ballantine, Round Lake, NY (US); Roger W. Cheek, Essex Junction, VT (US); Doreen D. DiMilia, Pleasantville, NY (US); Mark L. Reath, St. Albans, VT (US); Michael B. Rice, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 09/681,126

(22) Filed: Jan. 16, 2001

(65) Prior Publication Data
US 2002/0094681 A1    Jul. 18, 2002

(51) Int. Cl.
*H01L 21/66*    (2006.01)
*B05C 11/00*    (2006.01)

(52) U.S. Cl. .................... 438/14; 118/712; 427/255.23

(58) Field of Classification Search .................. 438/14; 118/708, 712, 715; 427/255.23, 255.28, 427/255.392
See application file for complete search history.

(56) References Cited

U.S. PATENT DOCUMENTS

| 4,145,913 A | * | 3/1979 | Brown et al. ............. 73/23.21 |
| 4,388,342 A | * | 6/1983 | Suzuki et al. ................. 427/8 |
| 4,918,033 A | | 4/1990 | Bartha et al. |
| 5,138,520 A | | 8/1992 | McMillan et al. |
| 5,190,913 A | | 3/1993 | Higashiyama et al. |
| 5,347,460 A | | 9/1994 | Gifford et al. |
| 5,574,247 A | * | 11/1996 | Nishitani et al. ........... 118/708 |
| 5,685,963 A | | 11/1997 | Lorimer et al. |
| 5,712,702 A | | 1/1998 | McGahay et al. |
| 5,716,495 A | | 2/1998 | Butterbaugh et al. |
| 5,736,740 A | * | 4/1998 | Franzen ...................... 250/288 |
| 5,763,007 A | | 6/1998 | Weiller |
| 5,808,299 A | | 9/1998 | Syage |

(Continued)

FOREIGN PATENT DOCUMENTS

JP    02179469 A    *    7/1990

(Continued)

OTHER PUBLICATIONS

Ebbin, "General Chemistry", 4th Ed., Houghton Mifflin Company, 1993, p. 865.*

(Continued)

*Primary Examiner*—Jerome Jackson
*Assistant Examiner*—José R. Diaz
(74) *Attorney, Agent, or Firm*—DeLio & Peterson, LLC; John J. Tomaszewski; William D. Sabo

(57) ABSTRACT

A method and apparatus are provided for controlling a CVD process used to deposit films on semiconductor substrates wherein the by-products of the reaction are measured and monitored during the reaction preferably using mass spectrometry and the results used to calculate the concentrations of the by-products and to control the CVD reaction process based on the by-product concentrations. An exemplary CVD process is the deposition of tungsten metal on a semiconductor wafer. A preferred method and apparatus uses a capillary gas sampling device for removing the by-product gases of the reaction as a feed for the mass spectrometer. The capillary gas sampling device is preferably connected to a differential pump.

9 Claims, 3 Drawing Sheets

U.S. PATENT DOCUMENTS

| | | | |
|---|---|---|---|
| 5,834,371 A | 11/1998 | Ameen et al. | |
| 5,879,574 A | 3/1999 | Sivaramakrishnan et al. | |
| 6,077,355 A * | 6/2000 | Yamashita et al. | 118/708 |
| 6,399,484 B1 * | 6/2002 | Yamasaki et al. | 438/648 |
| 6,483,108 B1 * | 11/2002 | Sakairi | 250/288 |
| 6,548,847 B1 * | 4/2003 | Sugiura et al. | 257/296 |
| 6,774,359 B1 * | 8/2004 | Hirabayashi et al. | 250/287 |
| 2001/0000865 A1 * | 5/2001 | Gaughen et al. | 118/50.1 |
| 2002/0015466 A1 * | 2/2002 | Akiba et al. | 376/427 |
| 2002/0039803 A1 * | 4/2002 | Khandan et al. | 438/14 |
| 2002/0060157 A1 * | 5/2002 | Calvert et al. | 205/82 |
| 2002/0192394 A1 * | 12/2002 | Ebe et al. | 427/569 |

FOREIGN PATENT DOCUMENTS

KR          2000020811 A  *  4/2000

OTHER PUBLICATIONS

J. G. Hoffarth et al. *Exhaust Flowmeter/Mass Spectrometer Plasma Process Monitor*. Research Disclosure, Apr. 1986, No. 264 (Kenneth Mason Publications Ltd., England). EN884-0585.

J. Bartha et al. *In Situ Determination of Growth Rate and Stoichiometry in a Heterogeneous CVD Reactor*. IBM Technical Disclosure Bulletin, vol. 29, No. 11 (Apr. 1987) p. 4851.

* cited by examiner

IN-SITU MONITORING OF CHEMICAL VAPOR DEPOSITION PROCESS BY MASS SPECTROMETRY

BACKGROUND OF THE INVENTION

1. Field of the Invention

This invention relates to the field of semiconductor processing and manufacturing wherein chemical vapor deposition is used to deposit various films and fill interconnect structures on a semiconductor wafer.

2. Description of Related Art

Chemical vapor deposition (CVD) processes are used to deposit circuit elements on a substrate such as a semiconductor wafer by chemical reduction of vapor of a volatile chemical in contact with the wafer. One such process involves the formation of a tungsten metal layer by reduction of WF6.

Chemical vapor deposition (CVD) systems commonly consist of many valves, tubes, fittings, etc. which are used to control a complex chemical reaction. Any one or more of these systems may fail or deviate by any number of possible mechanisms resulting in air leaks, incorrect reactant flows, and the like and most of these failures have a significant negative impact on the entire CVD process. When these CVD systems are in a manufacturing environment, it is very important that they be monitored so as to not interrupt the normal manufacturing flow except at times of real impact to the quality of the product.

The problem of monitoring CVD reactions has been recognized by those skilled in the art and the prior art discloses many different ways of monitoring the chemical reactions which take place in a CVD reaction chamber. Primarily these methods are directed to monitoring the CVD process for the presence of contaminants such as atmospheric gases or the concentrations of reaction precursors. However, attempts to detect the presence of atmospheric contaminants often fail because of the complexity of the reaction environment in the CVD chamber. If the CVD system were a simple vacuum system like a sputter deposition system, then discerning an air leak would be fairly straightforward because the mass spectrum of the environment inside the chamber would display the characteristic mass spectrum of the air. This is not possible in the CVD process since the characteristic mass spectrum of the air leak is obscured by the mass spectrum of the entire process, product, and carrier gases which are present in significantly higher relative concentrations. Thus, it is desirable to find a more robust method of monitoring CVD processes.

Bearing in mind the problems and deficiencies of the prior art, it is therefore an object of the present invention to provide a robust method of monitoring CVD processes.

It is another object of the present invention to provide a method of monitoring CVD processes which overcomes the complexity of the particular CVD reaction or minute variations in the reactant concentrations.

Another object of the present invention is to provide an improved CVD apparatus.

Still other objects and advantages of the invention will in part be obvious and will in part be apparent from the specification.

BRIEF SUMMARY OF THE INVENTION

The above and other objects and advantages, which will be apparent to one of skill in the art, are achieved in the present invention which is directed to, in a first aspect, a method of chemical vapor deposition comprising the steps of:

providing a semiconductor substrate in a chemical vapor reaction chamber; introducing reactant materials into the chamber;

effectuating a reaction between the reactant materials to produce a desired end product and at least one gaseous by-product;

forming the desired end product on a surface of the substrate; and monitoring one or more properties of one or more of the gaseous by-products during the reaction and controlling the deposition process based on at least one of the monitored properties.

In another aspect of the invention, an apparatus for performing a chemical vapor deposition process is provided comprising:

a deposition chamber containing one or more substrates;

an intake that introduces reactants into the chamber;

an outtake that removes reactant and by-product gases from the chamber; and a monitor coupled to the outtake that determines a property of the removed gases, the monitor producing one or more signals that control the apparatus based on the determined property of at least one of the by-product gases.

BRIEF DESCRIPTION OF THE SEVERAL VIEWS OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
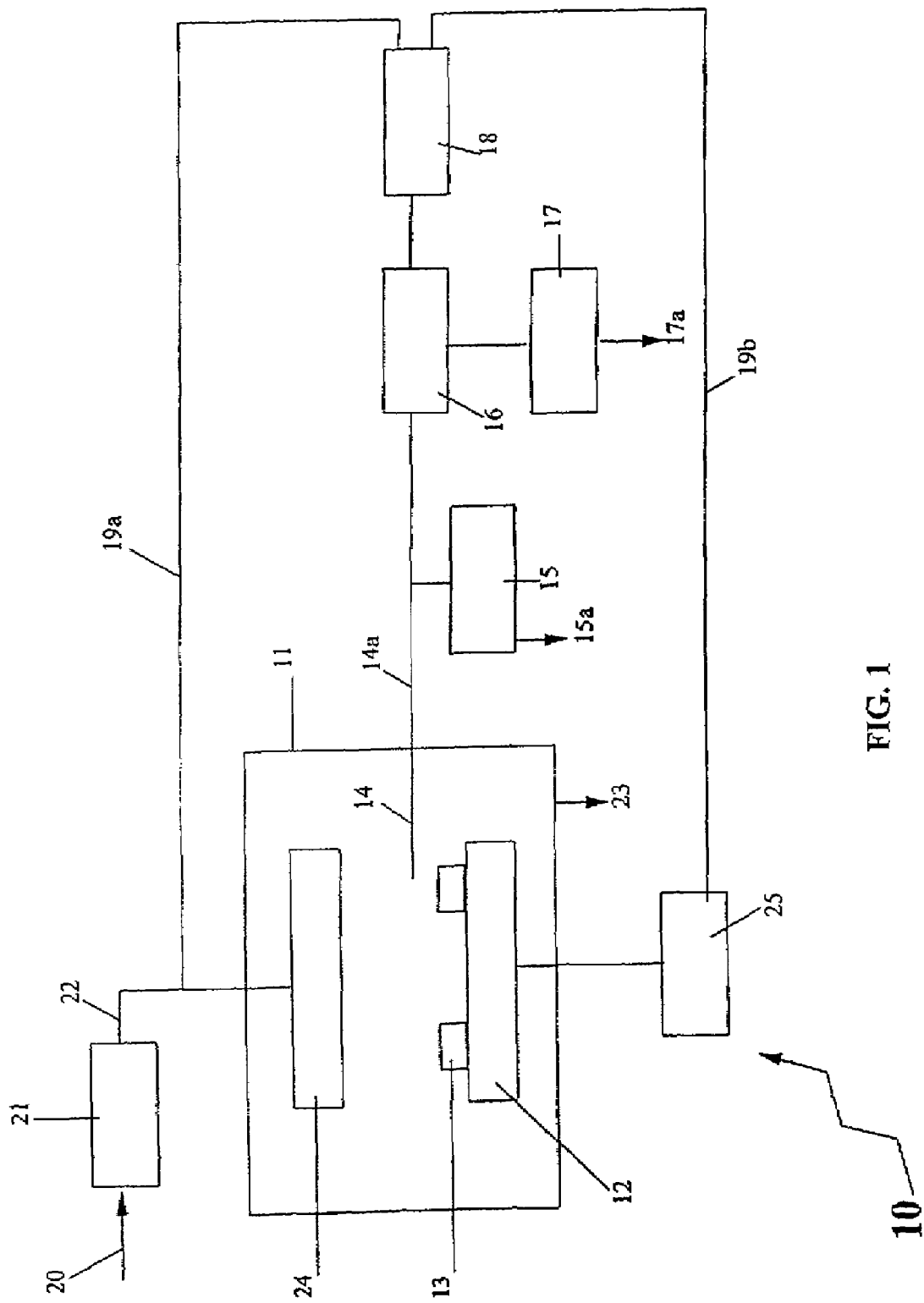
FIG. 1 is a schematic illustration of a CVD apparatus and method in accordance with the present invention.

In describing the preferred embodiment of the present invention, reference will be made herein to FIGS. 1–3 of the drawings in which like numerals refer to like features of the invention. Features of the invention are not necessarily shown to scale in the drawings.

CVD relies on non-reactive carrier gases to transport precursors of the desired material to the substrate surface. Here the precursors react with other gases or decompose to produce stable reaction products, which are formed on the substrate. CVD methods are among the most versatile deposition techniques because a wide range of chemical reactants and reactions can be used to form a large number of different types of films on substrates for a wide range of applications.

CVD is normally performed under vacuum using a reactor which comprises a reaction chamber; thermal heating or plasma energy sources that provide the needed energy for the chemical reactions to occur; gas carriers; source reactant materials and means to conduct the source materials to the substrate surface; and exhaust means to exhaust the unreacted reactants and by-products from the reactor. In the reaction chamber, the reactive agents in the carrier gas flow across the substrate(s) and a chemical reaction or set of reactions takes place as a result of energy provided by some external source, such as thermal heaters or a plasma discharge.

A number of variations on and subcategories of CVD techniques have been developed. Some of the more common techniques include MOCVD, PECVD and APCVD. Metalorganic CVD (MOCVD) uses a thermally heated reaction chamber and reactant sources that are organometallic in nature. Plasma-enhanced CVD (PECVD) uses a plasma discharge to provide the excitation necessary for chemical reaction to occur. PECVD is often used for diamond deposition. Atmospheric pressure CVD (APCVD) does not require a vacuum, and it can be performed in a continuous process with a belt transporting a continuous flow of substrates in and out of the deposition chamber. Applications of this technique include oxides and silicate glasses.

Many variations of these basic processes have been developed for and adapted to the deposition of a wide variety of materials.

A typical process flow for a CVD process comprises the following:

1. The reactants are transported and introduced to the deposition reactor chamber in a carrier gas flow.

2. The reactants contact the substrate surface where reactions take place such that at least one product is a solid, which forms on the surface.

3. Volatile reaction by-products are desorbed and transported away from the deposition region, eventually being evacuated from the deposition chamber.

A typical general (unbalanced) overall reaction process to deposit metallic tungsten on a semiconductor substrate is as follows: WF6+SiH4 →  Wo+SiF4+HF+H2+SiHF3+SiH2F2+SiH3F SiF4, HF, SiHF3, SiH2F2, SiH3F and H2 are some of the reaction by-products and are monitored using the method and apparatus of the invention to control the CVD process. Argon and hydrogen are typical carrier gases and are flowed into the CVD reactor in excess quantities.

A typical CVD apparatus is shown in U.S. Pat. Nos. 5,834,371 and 4,918,033 which patents are hereby incorporated by reference.

Referring to FIG. 1, a chemical vapor deposition (CVD) apparatus is shown in schematic generally as 10. The apparatus comprises a reaction chamber 11 with a heated pedestal 12 which supports the substrates 13. The chemical reaction taking place within the chamber is initiated as a result of the energy provided by some external force such as the pedestal 12 or a plasma discharge as well known in the art. Substrates, typically semiconductor wafers 13, are positioned on the pedestal 12 in the chamber 11. Reactant gases including carrier gases shown collectively as 20 are fed into a mixer 21 and then passed through line 22 into reaction chamber 11 into a showerhead 24 for delivering the reactant gases. A small portion of the process gases 14a are removed through a capillary sample device 14 by a pump 15 and a small portion of these gases is passed through a mass spectrometer 16 for mass spectrographic analysis. It is preferred to use a differential pump illustrated here as 15, to achieve high gas flow through the capillary, resulting in a rapid response time, while simultaneously lowering the pressure at the inlet to the mass spectrometer 16. Note also that the capillary 14 is disposed proximate the substrate 13, in order to maximize the partial pressures of the reactant gases to be monitored. In a different reaction, depending on the chamber configuration, the reaction, and other variables, it may be desirable to dispose the capillary at a location spaced from the substrate 13, if that is where the by-product partial pressures are greatest.

Typically, only a portion of the exhaust gases of the reactor will be passed through the pump 15 and mass spectrometer 16 with most of the gases being exhausted through vacuum line 23. In any event, the excess exhaust gases 14a are discharged through 15a and the analyzed exhaust gases 14a are then discharged through pump 17 and exhaust 17a. The measurement results of the mass spectrometer analysis of the exhaust gases are calculated in computer 18 which results are used to control the process as discussed hereinbelow. Broadly stated, based on the by-product concentration measurement results in computer 18, control signals will be sent through line 19b, for example, to a heater controller 25 which controls the energy to the heated pedestal 12 and through line 19a to the reactant gas flow system to control the reactant gas flow.

An example of depositing tungsten on a semiconductor substrate is the reaction shown above wherein WF6 is reacted with silane to produce tungsten metal and a number of by-products including SiHF3, SiH2F2, SiF4, HF and H2 and it is these or other reaction by-products which are monitored using the mass spectrometer 16 of FIG. 1. The values of these by-product concentrations will determine the control of the process with regard to increasing reactant flow rates, changing the temperature, etc. as will be appreciated by those skilled in the art. An isotope may be incorporated into one or more of the reactants to distinguish species which would otherwise be indistinguishable, but originate from different precursors, e.g., deuterium from SiD2H2 versus hydrogen from H2.

The present invention provides a method of controlling and monitoring a CVD process by the changes in concentrations of reaction by-products which are the result of a CVD reaction. By-product partial pressures (concentrations) may be measured by mass spectrometry or other such measuring means. A change in by-product concentration means there has been a change somewhere in the system which has affected the reaction providing a direct correlation to the desired result of the CVD process. The reactions used in a CVD system are generally heterogeneous reactions for which one, or more, of the reaction products is a solid thin film, generally the desired end product. Usually, there are also one or more reaction by-products which are volatile. The monitoring of reaction by-products results in a monitoring method that is sensitive, more robust and less prone to false alarms. In the invention, the output of the monitor is fed to a computer 18 that compares the monitored values to the expected values. The expected values vary over time, as a function of the sequence of steps carried out in the deposition process, as previously indicated. If a monitored value increases above or decreases below the expected value, the computer produces control signals 19a, 19b that controls the heater and values for the source reaction product. If the difference between the monitored and expected values is too large, or persists for too long, the computer produces a control signal that suspends operation of the chamber or initiates a sequence of error recovery operations.

Although mass spectrometry is used to illustrate the measurement made, the by-products may also be monitored using a variety of well-known analytical techniques known in the art.

Figure 2:
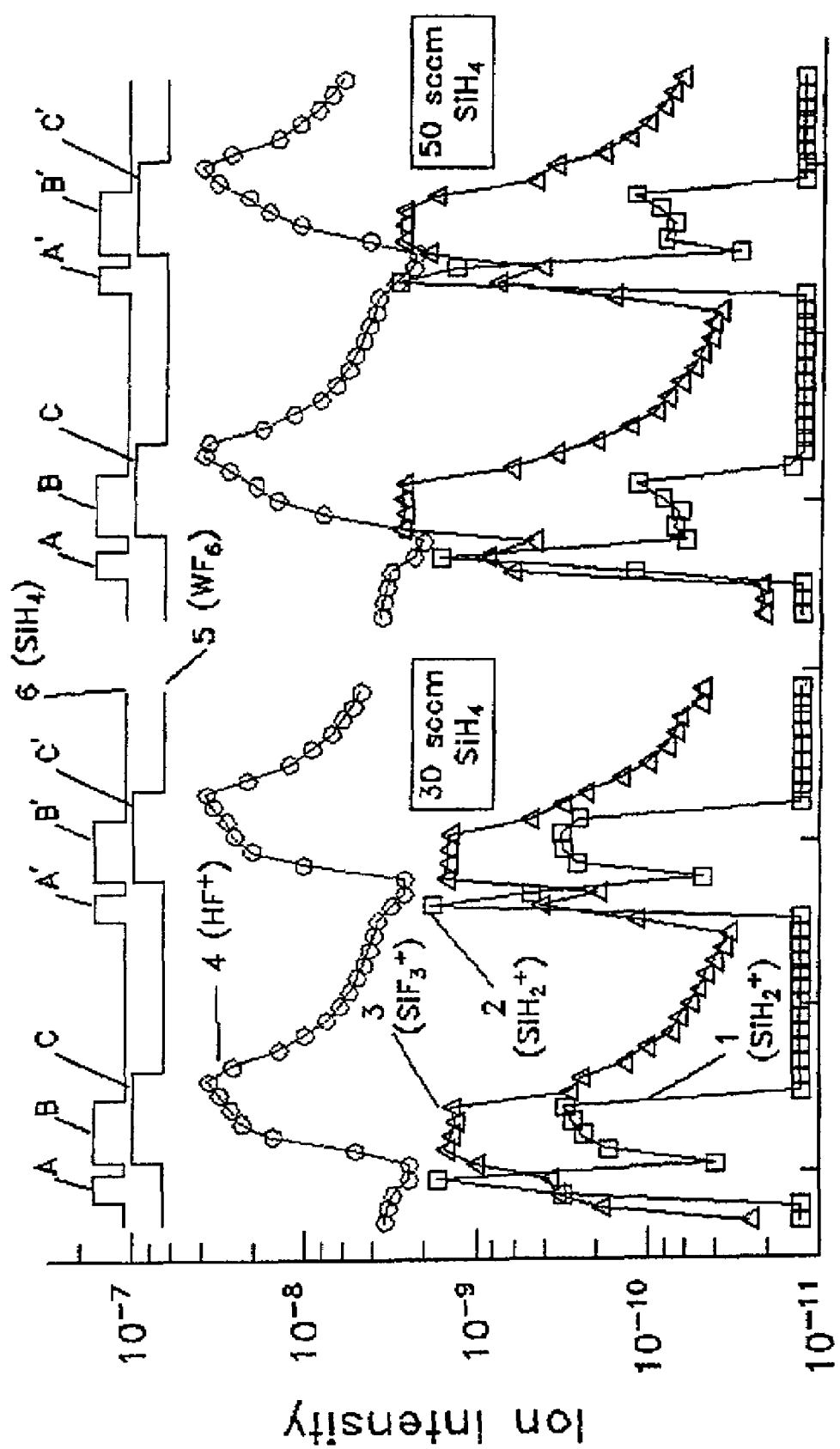
FIG. 2 is a graph over time of a CVD reaction using WF6 and SiH4 reactants with H2 and Ar showing the mass spectral ion intensity of the reactants and reaction products and the points of introduction of the WF6 and SiH4 reactants into the reaction chamber.

Referring to FIG. 2, the reaction of WF6 with SiH4 in a CVD chamber such as in FIG. 1 is shown. The curves at the left side of the figure represent a SiH4 inlet flow of 30 sccm. The curves at the right side represent a SiH4 inlet flow of 50 sccm. The WF6 "valve open" inlet flow is constant. Argon and H2 (not shown) are continuously flowing into the reactor as carrier gases and reactant, respectively, in excess amounts. The curves represent the intensity (concentration) of selected reactants and reaction products.

Figure 3:
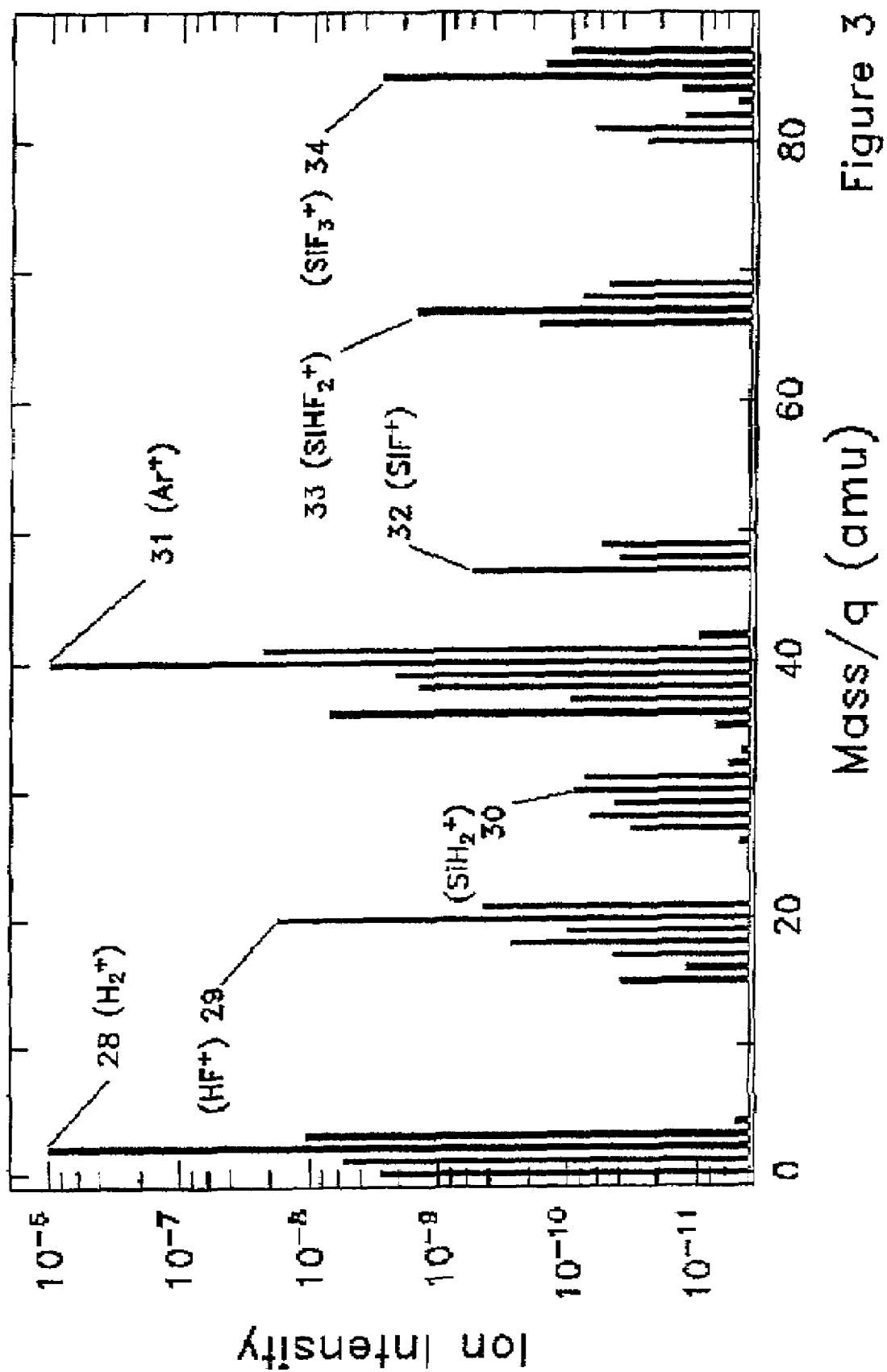
FIG. 3 is a graph showing the full mass spectrum taken at point 7 in FIG. 2.

Curve 1 represents the concentration of SiH2+ (which includes Si0, SiH, SiH3, and SiH4 as adjacent mass peaks, 30 in FIG. 3). The term + indicates the ionic fragment that is measured by the mass spectrometer. Curve 3 represents the intensity of SiF3+ at mass 85. Curve 4 represents the intensity of the HF+ ion at mass 20. Curve 5 represents the flow of WF6 into the reactor where the higher position corresponds to the valve being open. Curve 6 represents the flow of silane (SiH4) into the reactor where the higher position corresponds to the valve being open.

The points at the time labeled 7 in FIG. 1 correspond to those in the mass spectrum shown in FIG. 3. In this spectrum, the peak labeled 28 is at mass 2 and originates from H2+. The peak labeled 31 corresponds to carrier gas Ar+ at mass 40. Both of these gases are flowed continuously in copious quantities during the process. The peak labeled 29 is mass 20 from HF+ and the peak at 30 is from SiH2+. The adjacent peaks at 28, 29 and 31 are from the Si with 0, 1 and 3 H atoms, respectively. Peak 32 at mass 47 and peak 33 at mass 67 correspond to SiF+ and SiHF2+, respectively. The adjacent peaks are from ions with different numbers of H atoms. The peak labeled 34 at mass 85 arises from SiF3+ ion. The two peaks at 86 and 87 arise from the isotopes of the Si atom.

This spectrum illustrates that all reaction products can be simultaneously monitored with an RGA and variations in the process readily detected.

Referring again to FIG. 2, the reaction of WF6 with silane in a CVD chamber such as in FIG. 1 is shown wherein the silane is introduced at either 30 standard cubic centimeter per minute (sccm) or 50 sccm. Thus, at the times A and A', it is seen that silane (curve 6) is introduced into the chamber whereas the WF6 is not (curve 5). This increases the concentration of silane in the chamber as seen from FIG. 2 at the point labeled 2. When the WF6 valve is open as shown at curve 5 at times B and B' and the silane valve is open as shown at curve 6 (point B) the concentration of the by-product of SiF4 increases as shown in curve 3 (the SiF3 + ion) and the concentration of HF increases as shown in curve 4 (HF+ ion). During the period B in which both valves are open, the silane reactant intensity is reduced and the SiF3+ and HF+ intensities increase reflecting the reaction of silane with WF6 to produce SiF4 and HF or combinations of SiF and H. After the silane valve closes during time period C, the WF6 continues to react with the H2 that is continuously flowing to produce HF as shown by the continuing rise in the HF+ peak. When WF6 valve is closed at the end of point C the production of HF ceases and its intensity decreases as it is pumped from the reaction chamber. The above cycle is repeated starting at point A' when the silane valve is open and at points B' and C' when the WF6 valve is opened.

The same reaction is shown on the right side of FIG. 2 wherein a silane flow rate of 50 sccm is used. Points A, B and C and A', B' and C' correspond to the same reference points on the left side of the figure for the lower silane flow rate of 30 sccm.

Point 7 in FIG. 2 represents the point in time at which the mass spectrum of FIG. 3 was generated. In other words, the gases in the reactor were sampled at point 7 as shown in FIG. 1 and passed through a mass spectrometer to obtain the spectra shown in FIG. 3.

EXAMPLE

The following table shows the ion intensities from a mass spectrometer analysis of exhaust gases versus silane flow in sccm measured using the reaction chamber shown in FIG. 1 and the corresponding reaction shown in FIG. 2. TABLE Silane Flow (sccm) SiF3+SiH2+ 301.740.32402.150.57502.830.08

From the table it can be seen the SiF3+ intensity at mass 85, which is a direct measure of the partial pressure of the SiF4+ reaction by-product, varies linearly with the silane flow. However, the SiH2+ intensity, reflecting the SiH4+ (silane partial pressure, shows no correlation with the flow of silane. This reflects the fact that the reactant partial pressure can vary due to various reactants and its reactions, whereas the by-product species more directly reflects the rate of the desired chemical reaction. In other words, by measuring the concentration of the by-product SiF4+ during the reaction, the reaction can be controlled based on its value. Thus, a reduction in SiF3+ partial pressure during the deposition indicates a reduction in silane flow.

While the present invention has been particularly described, in conjunction with a specific preferred embodiment, it is evident that many alternatives, modifications and variations will be apparent to those skilled in the art in light of the foregoing description. For example, while the monitored property of the by-products is disclosed as partial pressures, other properties of the by products could be monitored. It is therefore contemplated that the appended claims will embrace any such alternatives, modifications and variations as falling within the true scope and spirit of the present invention.

What is claimed is:

1. A method of chemical vapor deposition comprising the steps of:

providing a semiconductor substrate in a chemical vapor reaction chamber;

positioning a capillary tube proximate the semiconductor substrate for removal of a gas sample;

providing measuring and monitoring means for measuring and monitoring one or more properties of one or more gaseous-by-products formed in the chemical vapor reaction chamber;

providing a pump outside the chamber in communication with the capillary tube and measuring and monitoring means and positioned between the capillary tube and the measuring and monitoring means;

introducing reactant materials into the chamber;

effectuating a reaction between the reactant materials to produce a desired end product and at least one gaseous by-product;

forming the desired end product on a surface of the substrate;

removing with the pump a sample of the gases from the chamber including at least one gaseous by-product through the capillary tube and passing the pumped sample to the measuring and monitoring means; and measuring and monitoring one or more properties of one or more of the gaseous by-products during the reaction and controlling the deposition method based on the measured and monitored gaseous by-product properties.

2. The method of claim 1 wherein the removing step is performed using a differential pump.

3. The method of claim 2 wherein the sample is monitored using a mass spectrometer.

4. The method of claim 1 wherein the desired end product is tungsten and one of the reactant materials is WF6.

5. The method of claim 1 wherein an isotope is incorporated into one or more of the reactant materials.

6. The method of claim 1 wherein the monitored property is concentration of the gaseous by-product.

7. The method of claim 6 wherein the concentration of the gaseous by-product is monitored using a mass spectrometer.

8. The method of claim 7 wherein all the gaseous by-products are measured to obtain a mass spectrum and simultaneously monitored so that variations in the process are readily detected.

9. The method as recited in claim 1, further comprising the step of determining a gaseous by-product to be monitored by determining an extent to which a change in a monitored property of such gaseous by-product indicates a change in a concentration of a reactant material.

* * * * *